United States Patent
Zhang et al.

(10) Patent No.: US 6,778,022 B1
(45) Date of Patent: Aug. 17, 2004

(54) VCO WITH HIGH-Q SWITCHING CAPACITOR BANK

(75) Inventors: Pengfei Zhang, Fremont, CA (US); Chet Soorapanth, Mountain View, CA (US)

(73) Assignee: RF Micro Devices, Inc., Greensboro, NC (US)

( * ) Notice: Subject to any disclaimer, the term of this patent is extended or adjusted under 35 U.S.C. 154(b) by 134 days.

(21) Appl. No.: 10/057,707

(22) Filed: Jan. 24, 2002

Related U.S. Application Data
(60) Provisional application No. 60/292,257, filed on May 17, 2001.

(51) Int. Cl.[7] .............................. H03L 7/00; H03B 5/00
(52) U.S. Cl. ...................... 331/14; 331/16; 331/117 R; 331/117 FE; 331/177 R; 331/177 V
(58) Field of Search ...................... 331/117 R, 117 FE, 331/14, 177 R, 177 V, 16

(56) References Cited

U.S. PATENT DOCUMENTS

| | | | | |
|---|---|---|---|---|
| 3,784,917 A | * | 1/1974 | Kenyon ...................... | 325/422 |
| 4,612,585 A | | 9/1986 | Takase et al. | |
| 4,673,892 A | * | 6/1987 | Miyashita et al. ............ | 331/14 |
| 4,766,497 A | | 8/1988 | Banach et al. | |
| 5,635,892 A | | 6/1997 | Ashby et al. | |
| 5,736,749 A | | 4/1998 | Xie | |
| 5,745,838 A | | 4/1998 | Tresness et al. | |
| 6,008,102 A | | 12/1999 | Alford et al. | |
| 6,031,432 A | | 2/2000 | Schreuders | |
| 6,233,441 B1 | * | 5/2001 | Welland ................... | 331/117 R |
| 6,239,665 B1 | * | 5/2001 | Strom ................... | 331/117 FE |
| 6,542,043 B1 | * | 4/2003 | Cao ...................... | 331/117 FE |

FOREIGN PATENT DOCUMENTS

JP 01208902 * 8/1989

OTHER PUBLICATIONS

Gibilisco "Handbook of Radio & Wireless Technology" McGraw-Hill 1999 p. 91.*
Rogers et al. "The effect of varactor nonlinearity on the phase noise of completely integrated VCO's" IEEE Journal of Solid-State Circuits, No 35 Issue 9 Sep. 2000 pp 1360-1367.*
Lam et al., "A 2.6-GHz/5.2-GHz Frequency Synthesizer in 0.4-$\mu$m CMOS Technology", IEEE Journal of Solid-State Circuits, vol. 35, No. 5, May 2000, pp. 788-794.
Rategh et al., "A CMOS Frequency Synthesizer with an Injection-Locked Frequency Divider for a 5-GHz Wireless LAN Receiver", IEEE Journal of Solid-State Circuits, vol. 35, No. 5, May 2000, pp. 780-787.
Samavati et al., "A 5-GHz CMOS Wireless LAN Receiver Front End", IEEE Journal of Solid-State Circuits, vol. 35, No. 5, May 2000, pp. 765-772.

(List continued on next page.)

Primary Examiner—Michael B Shingleton
(74) Attorney, Agent, or Firm—Withrow & Terranova, PLLC

(57) ABSTRACT

Circuits and methods for tuning voltage-controlled oscillators. A control voltage is applied through an isolation resistor to a varactor. The varactor capacitance is AC coupled through a second capacitance. The control voltage may be analog or digital. In a specific embodiment, multiple tuning diodes, and both analog and digital control voltages are used. The isolation resistor is outside the VCO tank circuit for low phase noise, excessive $K_{VCO}$ is reduced, and the control and output voltages of the oscillator may swing over the entire supply range. The varactor capacitance may be junction, MOS, or other type of varactor.

26 Claims, 11 Drawing Sheets

OTHER PUBLICATIONS

Wong et al., "A Wide Turning Range Gated Varactor", IEEE Journal of Solid–State Circuits, vol. 35, No. 5, May 2000, pp. 773–779.

Liu et al., "5–GHz CMOS Radio Transceiver Front–End Chipset", IEEE Journal of Solid–State Circuits, vol. 35, No. 12, Dec. 2000, pp. 1927–1933.

Bautista et al., "A High IIP2 Downconversion Mixer Using Dynamic Matching", IEEE Journal of Solid–State Circuits, vol. 35, No. 12, Dec. 2000, pp. 1934–1941.

Steyaert et al., "A 2–V CMOS Cellular Transceiver Front–End", IEEE Journal of Solid–State Circuits, vol. 35, No. 12, Dec. 2000, pp. 195–1907.

* cited by examiner

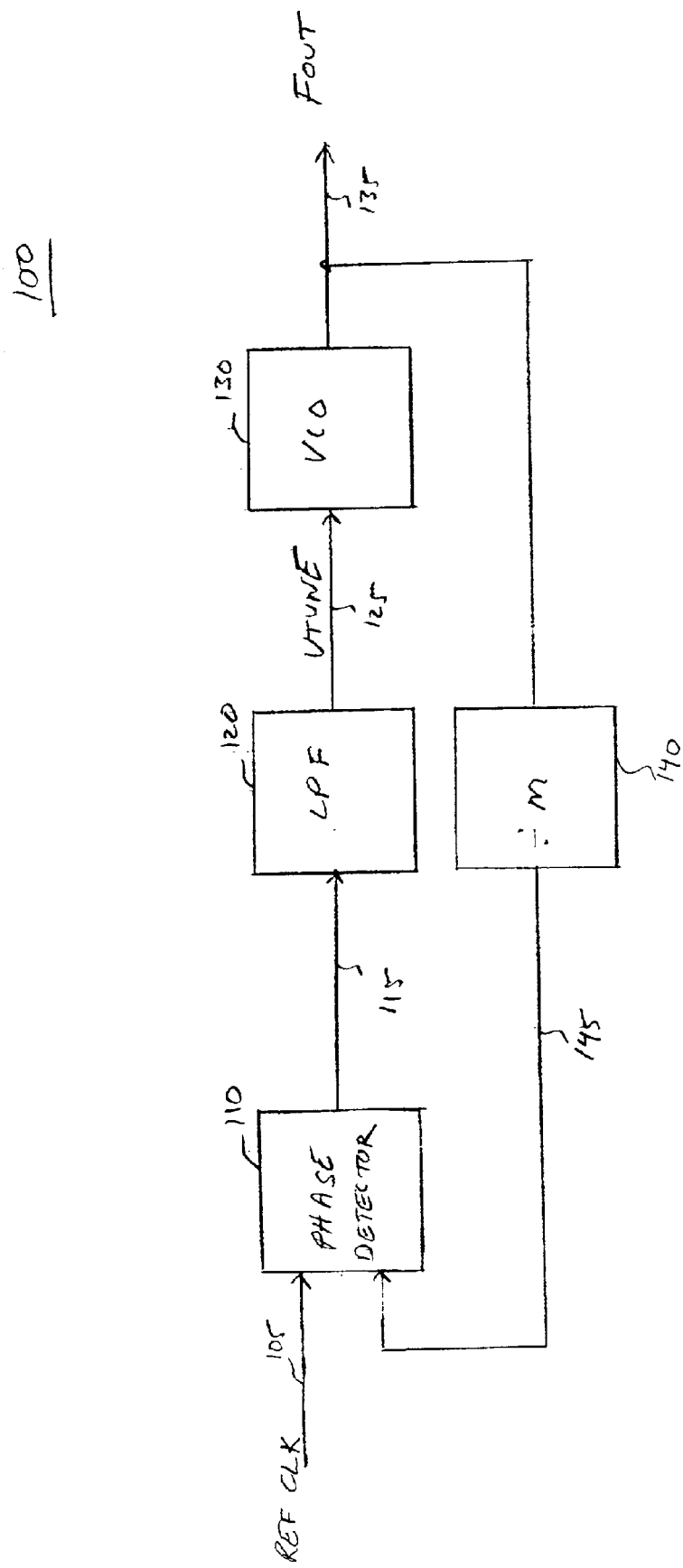

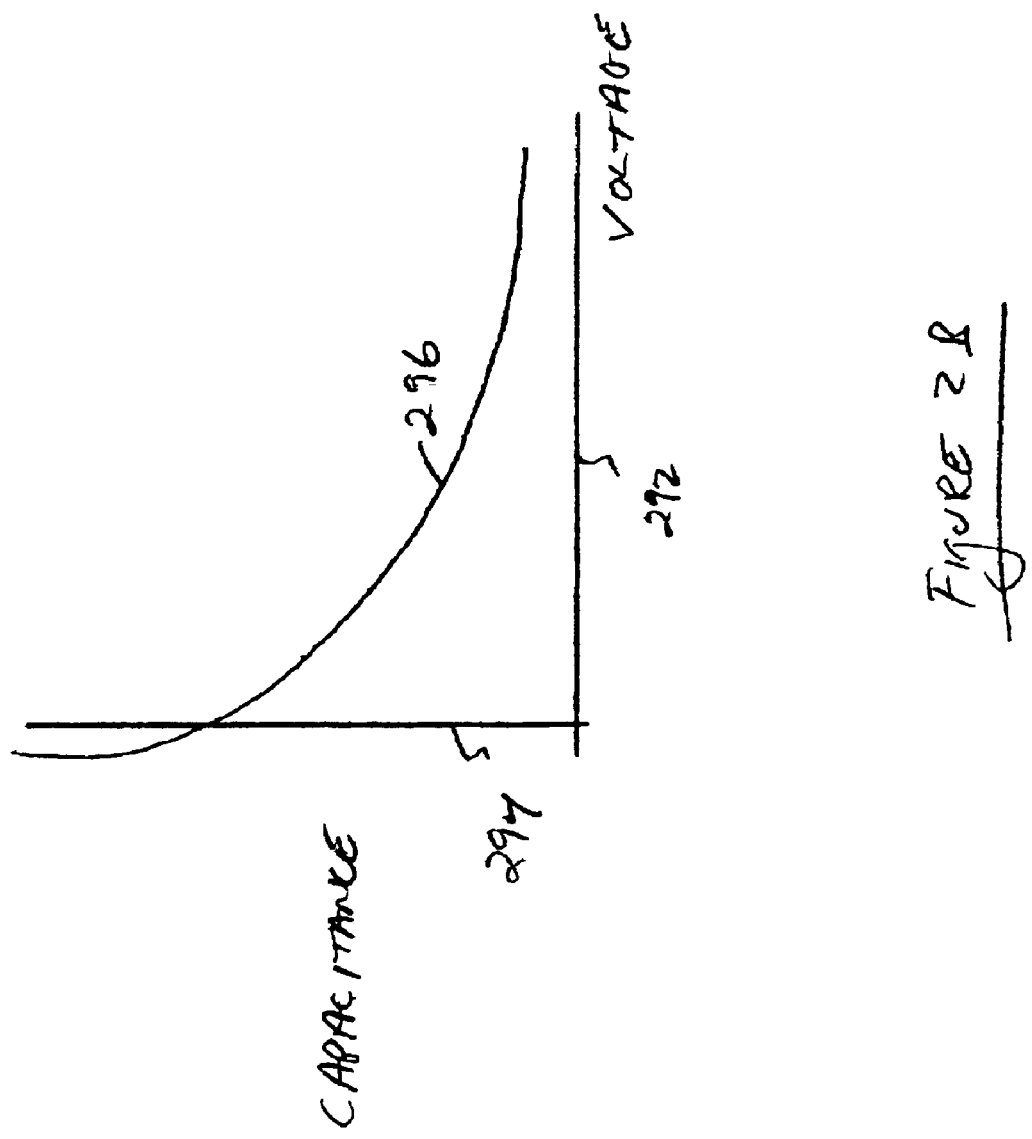

VCO WITH HIGH-Q SWITCHING CAPACITOR BANK

CROSS-REFERENCES TO RELATED APPLICATIONS

This application claims the benefit of U.S. provisional application No. 60/292,257 filed May 17, 2001, which is hereby incorporated by reference in its entirety.

BACKGROUND OF THE INVENTION

The field of wireless technology is currently undergoing a revolution and experiencing phenomenal growth. Mobile phones, once considered a novelty and referred to as "car phones," are now ubiquitous. A batch of wireless personal digital assistants, phones, and computer peripherals are entering the market, with wireless Internet access as a driving force. Wireless communications is one of the most important technology sectors of the our economy. This invention provides circuits and methods for a key building block in this marketplace.

Wireless devices typically transmit and receive data through the air using high-frequency electromagnetic waveforms. Data transmission is begun by encoding the data to be transmitted. The encoded data is used to modulate (i.e., is multiplied by) a high frequency carrier signal. This results in a signal having frequency components at the sum and difference of the frequencies of the multiplied signals. The low frequency difference component is filtered, and the high frequency sum component, the modulated carrier signal, is applied to an antenna for transmission. The transmitted signal is referred to as a radio frequency (RF) signal.

Reception involves receiving an RF signal on an antenna and filtering undesired spectral components. The signal is demodulated by multiplying it with a local oscillator (LO) signal having a frequency approximately equal to the frequency of the carrier signal. Again, the result is a signal having frequency components at the sum and difference of the frequencies of the LO and RF signals. The high frequency sum component is removed, while the low frequency difference component is the data signal, which is decoded.

The proper generation of the carrier and LO signals is of critical importance. Spurious frequency components, noise, and jitter distort the data signal and degrade reception. Also, the LO signal at the receiver needs to be tuned near the carrier's frequency. Too large a tuning range leads to phase noise, and too small a range may mean a receiver cannot be properly tuned. Thus, it is desirable to have circuits and methods for generating carrier and LO signals with high spectral purity, low phase noise and jitter, and proper tuning range.

SUMMARY OF THE INVENTION

An exemplary embodiment provides a voltage controlled oscillator (VCO) that may provide either or both carrier and local oscillator signals. A tuning voltage is applied to the VCO through a resistor to a varactor diode. The resulting capacitance of the varactor diode is AC coupled through another capacitor to a VCO tank circuit. The control voltage may be analog or continuous, as from a phase-locked loop (PLL), or digital, as from a trimming circuit In an exemplary embodiment, a plurality of tuning diodes, and both continuous and digital tuning are used.

AC coupling capacitors isolate the tank circuit from the varactor diode capacitances. This means that both the VCO output and control voltages can vary through the entire supply range without forward biasing the varactor diodes. Also, series resistances found in prior art variable capacitance networks are reduced, thus maintaining a high Q for the VCO tank circuit, which results in good start-up performance and low phase noise. Further, the capacitive coupling reduces the oscillator's $K_{vco}$ resulting in reduced sensitivity to noise on the VCO control voltages.

Another exemplary embodiment provides a method of tuning a voltage controlled oscillator. The method includes measuring a frequency of oscillation of the voltage controlled oscillator, comparing the frequency of oscillation to a desired frequency, generating a logic signal, and applying the logic signal to a resistor. The resistor is coupled to a fit capacitor and a second capacitor, the first capacitor is coupled to an inductor, and the second capacitor is coupled to a first supply terminal.

A further exemplary embodiment provides an integrated circuit. The integrated circuit has a VCO which includes a first inductor, a first capacitor coupled to the first inductor, a first varactor diode coupled to the first capacitor, and a first isolation resistor coupled to the first capacitor and the first varactor diode. The first isolation resistor is configured to receive a control voltage.

Another exemplary embodiment of the present invention provides an integrated circuit having a voltage controlled oscillator. The VCO includes a first inductor, a second inductor, a first capacitor coupled to the first inductor, a second capacitor coupled to the first inductor, a third capacitor coupled to the first capacitor, and a fourth capacitor coupled to the second capacitor. Also included are a first isolation resistor coupled to the first capacitor and the third capacitor, wherein the first isolation resistor is configured to receive a control voltage, a second isolation resistor coupled to the second capacitor and the second varactor diode, wherein the second isolation resistor is configured to receive the control voltage, a first device having a drain coupled to the first inductor and a gate coupled to the second inductor, and a second device having a drain coupled to the second inductor and a gate coupled to the first inductor.

Yet a further exemplary embodiment provides a phase-locked loop. The phase-locked loop includes a phase detector configured to receive a reference clock, a low-pass filter coupled to the phase detector, a voltage-controlled oscillator coupled to the low-pass filter, and a divider coupled between the voltage-controlled oscillator and the low-pass filter. The voltage-controlled oscillator includes a first inductor, a second inductor, a first capacitor coupled to the first inductor, a second capacitor coupled to the first inductor, a third capacitor coupled to the first capacitor, and a fourth capacitor coupled to the second capacitor. Also included is a first isolation resistor coupled to the first capacitor and the third capacitor, wherein the first isolation resistor is configured to receive a control voltage, a second isolation resistor coupled to the second capacitor and the fourth capacitor, wherein the second isolation resistor is configured to receive the control voltage, a first device having a drain coupled to the first inductor and a gate coupled to the second inductor, and a second device having a drain coupled to the second inductor and a gate coupled to the first inductor.

A better understanding of the nature and advantages of the present invention may be gained with reference to the following detailed description and the accompanying drawings.

BRIEF DESCRIPTION OF THE DRAWINGS

FIG. 1 is a block diagram of a phase-locked loop that may use VCOs consistent with embodiments of the present invention;

FIG. 2B is a plot of capacitance as a function of tuning voltage for a reverse-biased varactor diode that may be used in embodiments of the present invention;

DESCRIPTION OF SPECIFIC EMBODIMENTS

Embodiments of the present invention are explained below with reference to particular examples and figures.

FIG. 1 is a block diagram of a phase-locked loop (PLL) 100 which may use VCOs consistent with embodiments of the present invention. This block diagram, as with all the included figures, is shown for illustrative purposes only, and does not limit either the possible applications of embodiments of the present invention, or the claims. Included are a phase detector 110, low-pass filter (LPF) 120, voltage controlled oscillator (VCO) 130, and divider 140.

A reference clock is applied to the phase detector 110 on line 105. The reference clock may be generated by a crystal, or other periodic signal source. VCO 130 provides an output signal Fout on line 135. This signal, as with the other signals, may be single-ended or differential. Often, Fout is differential, while Vtune and the reference clock are single-ended. The divider 140 divides Fout's frequency, in this example by the value "m". Phase detector 110 compares the reference clock frequency to the frequency of the signal at the divider's output on line 145, and outputs a signal on line 115 having an amplitude that is proportional to the differences in their frequencies. The signal on line 115 is filtered by the low-pass filter 120, and applied to the VCO 130 as Vtune on line 125. The low-pass filter 120 may be fully integrated on-chip, alternately some or all of the filter may be off-chip.

The frequency of the output signal Fout from the VCO 130 varies with changes in Vtune. If the frequency of the signal at the output of the divider 140 is higher than the reference clock, the signal at the output 115 of phase detector 110, and thus Vtune, changes such that Fout's frequency decreases. Alternately, if the frequency of the signal at the output of the divider 140 is lower than the reference clock, the signal at the output 115 of phase detector 110, and thus Vtune, changes such that Fout's frequency increases. In this way, the VCO output Fout on line 135 maintains a frequency that is a multiple "m" of the frequency of the reference clock applied on line 105. One skilled in the art appreciates that this may be alternately configured. For example, a charge pump may be inserted between the phase detector 110 and low-pass filter 120.

Figure 2A:
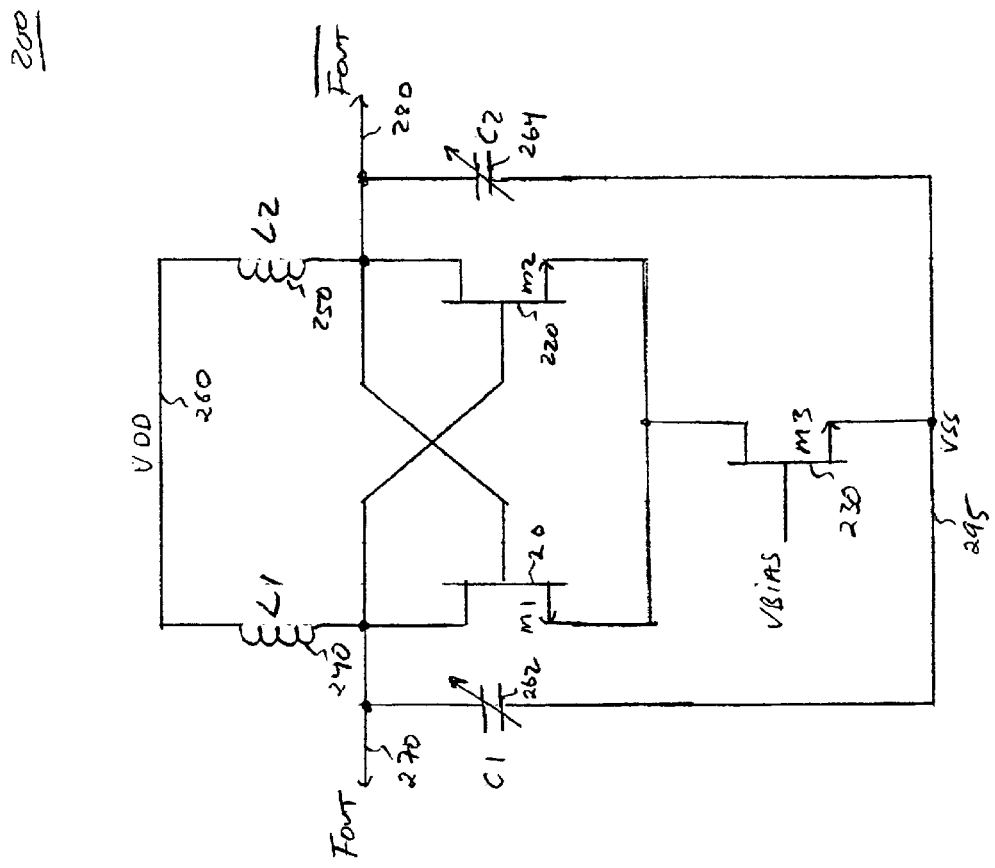
FIG. 2A is a simplified schematic of a VCO that may incorporate embodiments of the present invention.

FIG. 2A is a simplified schematic of a VCO 200 which may incorporate embodiments of the present invention. Included are devices M1 210 and M2 220, which form a differential pair connected in a positive feedback configuration, current source device M3 230, and an LC tank comprising inductors L1 240 and L2 250 and variable capacitors C1 262 and C2 264. The frequency of oscillation for the circuit is given by:

$$f = \frac{1}{2\pi\sqrt{LC}} \quad [29]$$

where L is the parallel combination of L1 and L2, and C is the parallel combination of C1 and C2. If the value of L1 is equal to the value of L2, and the value of C1 is equal to the value of C2, then L is one-half the value of L1, and C is twice the value of C1. For simplicity, the value of L1 can be used for L, and the value of C1 can be used for C, since the factors of 2 and one-half cancel. In practical embodiments, C also includes stray capacitances of the inductor, drain and gate capacitances of the differential pair, parasitic capacitances of the interconnect lines, and other capacitances. Thus, the frequency of oscillation of this VCO may be varied by changing the value of C.

In this specific example, n-channel CMOS, or NMOS devices are shown. Alternately, the devices may be HEMT, HBT, bipolar, JFET, p-channel MOS (PMOS), or other type device. The capacitors may be a series or parallel combination of capacitors. Specifically, the capacitors may be a parallel combination of multiple capacitors in series. The inductors may be on-chip spirals, bond wires, or traces, off-chip printed circuit board traces or inductors, a combination thereof, or other type inductor.

FIG. 2B shows capacitance as a function of tuning voltage for a varactor diode which may be used in embodiments of the present invention. The capacitance 296 of the varactor diode is plotted on a graph having a Y-axis 294 of capacitance and an X axis 292 of reverse-bias voltage. As can be seen, for low voltages the capacitance is at a maximum value, and the change in capacitance per change in voltage (the first derivative of the capacitance) is also at a maximum. Both the capacitance and the change in capacitance per change in voltage decrease with increasing voltage. It will be appreciated by one skilled in the art that other diodes and voltage dependent capacitances may have other characteristics, and may also be used in embodiments of the present invention.

Figure 2C:
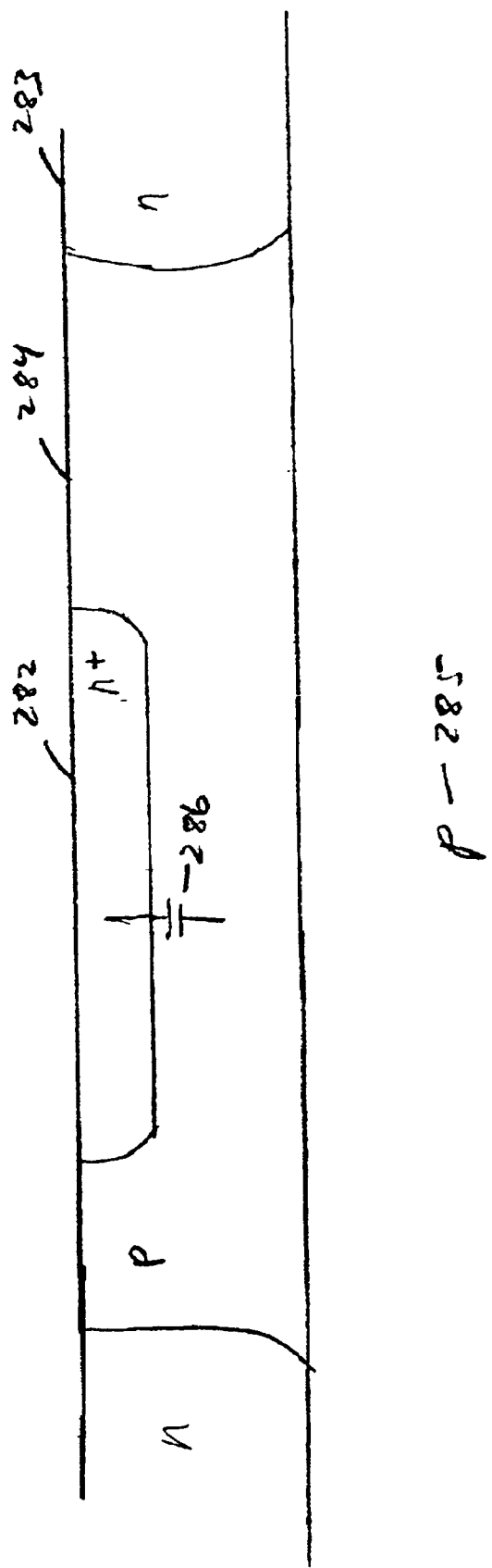
FIG. 2C is a side view of a varactor diode that may be used in an embodiment of the present invention.

FIG. 2C is a side view of a junction varactor or varactor diode that may be used in an embodiment of the present invention. A p-well 284 is diffused or implanted above a p-substrate 285; alternately the p-substrate itself may be used. In the p-well 284, an n-source/drain region 282, or other suitable n-type region, is diffused or implanted. The n-source/drain to p-well interface has an associated capacitance 286. This n-source/drain to p-well diode has a capacitance that decreases with increasing reverse bias voltage—that is as the voltage of region 282 increases relative to the voltage of region 284. Other types of variable capacitances may be used. For example, a psource/drain to n-well diode or other p-n junction may be used. Alternately, a MOS varactor may be used. A MOS varactor may be formed from an area or trace of polysilicon or metal over a n-well, p-well, or other region, where the polysilicon or metal is isolated by gate, field, "thin," or other oxide. Alternately, other insulating material may be used, and other materials than metal or polysilicon may be used. The variable capacitance may be on-chip or off-chip, or partly on-chip and partly off-chip.

Figure 3:
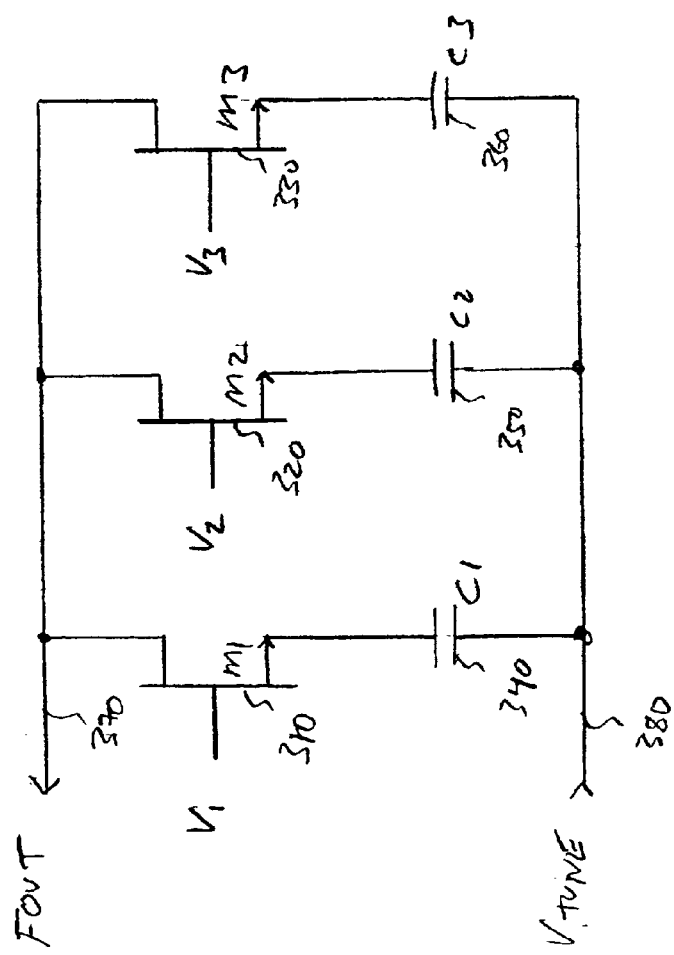
FIG. 3 shows a conventional method of digitally adjusting the value of a capacitor.

FIG. 3 shows a conventional method of digitally adjusting the capacitances in a VCO. Included are switch devices M1 310, M2 320, and M3 330, and capacitors C1 340, C2 350, and C3 360. Control voltages V1, V2, and V3 are applied to devices M1 310, M2 320, and M3 330. If a control voltage is high, its corresponding device is on, and its corresponding capacitor is connected to the VCO tank. If a control voltage is low, its corresponding capacitance is disconnected from the VCO tank, and does not contribute to the VCO frequency. In this way, as the control voltages are switched, the capacitance at the tank circuit is varied, and the VCO is changed or tuned in frequency.

But when a control voltage is high, its corresponding device does not make a perfect connection between its capacitor and the VCO tank. A significant series resistance of the device is present. This resistance adds phase noise to the VCO, and lowers the effective Q of the tank circuit. Increasing the device width reduces the series or "on" resistance. Unfortunately, the stray capacitance associated with the device increases, and when a device is off, its stray capacitance remains connected to the tank circuit. Increasing device size past a point effectively blurs the distinction between the capacitance seen by the tank when switch is on, and the capacitance seen when the switch is off.

There are many considerations to account for in designing VCOs, including $K_{vco}$ and sensitivity to noise on the control input. Unfortunately, the optimization of one is at odds with the optimization of the other. The $K_{vco}$ of an oscillator is defined as the change in frequency of the oscillator for a change in control voltage. A large $K_{vco}$ would enable the VCO to tune over a wide range of frequency, and would reduce design concerns about capacitor and inductor tolerances, temperature and supply variations, and the like. But when the $K_{vco}$ is low, the immunity to noise on the control line is maximized. This means that the frequency of the VCO does not change excessively in the presence of noise or signal coupling on the control line. This is of particular concern since in most designs the control line is a single ended signal. Thus, a low $K_{vco}$, such that noise on the control line has a reduced effect on the VCO frequency, is at odds with having a broad tuning range, which requires a higher $K_{vco}$.

There are many reasons why a VCO needs to be tuned. For example, the capacitance values are not the same each time an integrated circuit having this VCO is manufactured. This variation in value is known as process tolerance. Also, the inductors used are often on-chip spirals of metal, and the values of these also vary. The tolerance on these components is often plus or minus 20 percent. Variations in these values leads to variations in VCO oscillation frequency. Moreover, wireless transceivers often need to be compliant with multiple standards, each operating over a different frequency range. Some standards require the VCO frequency to change periodically, such as in a frequency-hopping or spread-spectrum system. The variable capacitances shown below in FIGS. 4 and 5 may be used to compensate for these process variations and to select between various transmission and reception bands.

There are at least two ways to tune a VCO. They may be digitally tuned, or continuously tuned (i.e., analog tuning). Digital tuning may be done during wafer manufacturing, wafer sort, final test, or at other times, to account for manufacturing tolerances. For example, memory cells, prom, fuses, zeners, or the like may be used to store voltage levels to be input to a switching capacitor bank. Either analog or digital tuning may be used to fine tune the VCO, or provide frequency hopping. Analog tuning may be used together or separate from digital tuning. Analog tuning voltages may be provided by phase-locked loops, for example Vtune on line 125 from the low-pass filter 120 in FIG. 1, or other sources.

Figure 4:
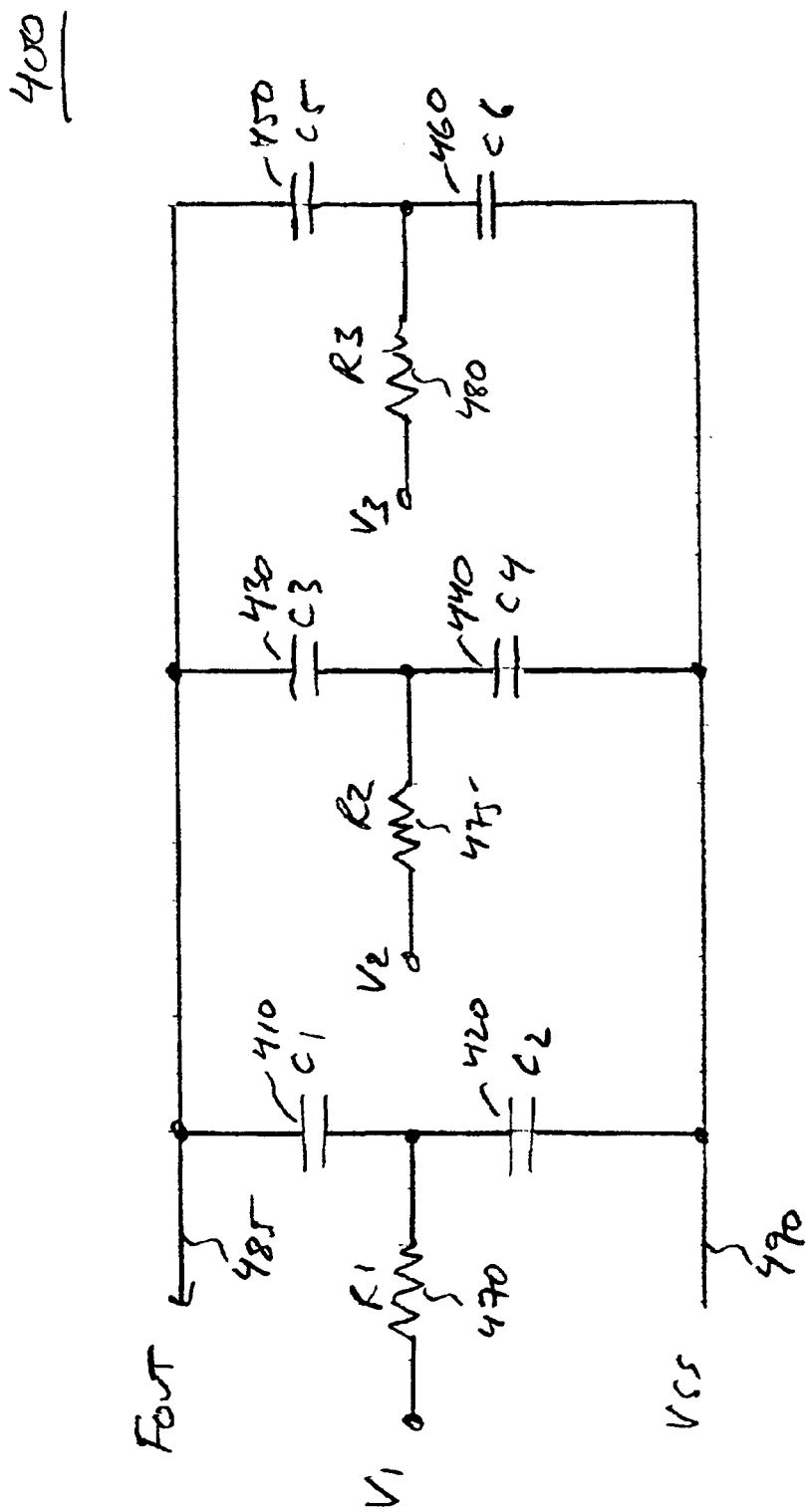
FIG. 4 is a schematic of a high-Q switching capacitor bank that may be used in embodiments of the present invention.

FIG. 4 is a schematic of a high-Q switching capacitor bank 400, which may be used in embodiments of the present invention. Included are series of capacitors C1 410 and C2 420, C3 430 and C4 440, and C5 450 and C6 460. Resistors R1 470, R2 475, and R3 480 couple to the common node of the series of capacitors, and are driven by control voltages V1, V2, and V3. In a specific embodiment, these voltages are digital, in other embodiments they may be analog or digital. One skilled in the art appreciates that other numbers of capacitors and resistors may be used, three are shown here for exemplary purposes only.

This circuit appears as a capacitance between nodes 485 and 490. Node 490 is shown as VSS. In other embodiments, node 490 can be VDD, or other appropriate a supply, control, bias, or circuit voltage. Often, there are two such high-Q switching capacitor banks, coupled to two nodes of the VCO. For example, in FIG. 2A, a high-Q switching capacitor bank may replace all or part of the variable capacitance C1 262 between nodes 270 and 290, while another replaces all or part of C2 264 between nodes 280 and 290.

In a specific embodiment, capacitors C2 420, C4 440, and C6 460 are reverse-biased varactor diodes, or junction varactors. Alternately, capacitors C2 420, C4 440, and C6 460 may be MOS varactors, or other variable capacitors. The control voltages V1, V2, and V3 are applied through resistors R1 470, R2 475, and R3 480 to capacitors C2 420, C4 440, and C6 460. Since the voltage Fout on line 485 is a sinewave, the average value of the voltage seen by capacitors C2 420, C4 440, and C6 460 is equal to the control voltages V1, V2, and V3. Thus, the control voltages V1, V2, and V3 determine the capacitance values of C2 420, C4 440, and C6 460. The resulting capacitances are AC coupled through capacitors C1 410, C3 430, and C5 450 to the VCO inductors, thus forming a tank circuit.

When a variable capacitance is reduced by a change in its corresponding control voltage, the value of the series capacitance is reduced, thus increasing the frequency of oscillation of the VCO. Conversely, when a variable capacitance is increased by a change in its corresponding control voltage, the value of the series capacitance is increased, thus decreasing the frequency of oscillation of the VCO. For example, if C2 420 represents a varactor diode having characteristics similar to those shown in FIG. 2B, as V1 increases relative to VSS, the value of C2's capacitance decreases, and the value of the combination of C1 410 and C2 420 decreases (with zero as a theoretical limit), thus increasing the frequency of oscillation. Conversely, as V1 decreases relative to VSS, the value of C2's capacitance increases, and the value of the combination of C1 410 and C2 420 increases (with the value of C1 420 as a theoretical limit), thus decreasing the frequency of oscillation.

The capacitors C1 410, C3 430, and C5 450 may be thin oxide, metal to metal, MOS, or other type of capacitor. The capacitors may use gate or other oxide, or other layer as insulating material. In a specific embodiment, these capacitors are designed to have a low voltage coefficient, that is their values do not vary strongly with changes in tune, supply, or control voltage. These capacitors may alternately be varactor capacitances, such as junction or MOS varactors, or other type of variable capacitors. The resistors may be resistors, parallel or series combinations of resistors, or properly biased active devices. The resistors may be formed from polysilicon, base or other diffusion or implant, or other resistive structure. For example, a resistor implant may be used.

The AC path is through the series capacitors between Fout line 485 and VSS line 490. Accordingly, there are no resistors and the AC path, meaning the circuit has a high Q and improved phase noise, and is thus referred to as a high-Q switching capacitor bank. Moreover, the control voltage is DC blocked by the coupling capacitor. This means that the tank and varactor are isolated from each other. Because of this, both the output of the VCO and the tuning or control voltages can vary over the entire supply range, without forward biasing the varactor diodes.

Again, in a specific embodiment, C2 420, C4 440, and C6 460 are MOS or junction varactors, while C1 410, C3 430, and C5 450 are "fixed," or low voltage sensitive, capacitors. Alternately, all or some may be varactor capacitances. The varactors may be junction varactors, such as a n-source-drain region in an p-well, a p-source drain region in an n-well or other appropriate structure, as discussed above. If a psource drain region is used, the diode may be coupled to VDD instead of VSS or ground as indicated in FIG. 4. Other variable capacitors may be used instead of varactor diode capacitors. For example, they be MOS varactors, such as a polysilicon or metal trace isolated by gate or other oxide from an n-well, p-well, or other region.

Figure 5:
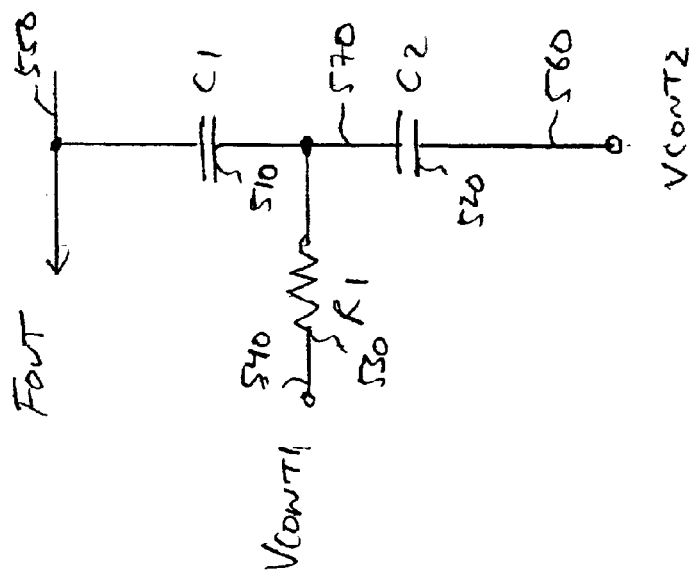
FIG. 5 is a schematic of another adjustable capacitance that may be used in embodiments of the present invention.

FIG. 5 is a schematic 500 of a variable capacitance consistent with an embodiment of the present invention. Included are capacitors C1 510 and C2 520, and isolation resistor R1 530. Capacitors C1 510 and C2 520 form a series of capacitors, with R1 530 connected to the common point. In this embodiment, two control voltages are provided, specifically Vcont1 on line 540, which drives R1 530, and Vcont2 on line 560, which drives C2 520.

This circuit appears as a capacitance between nodes 550 and 560. Often, there are two such networks, coupled to two nodes of a VCO. For example, in FIG. 2A, a network may replace all or part of the variable capacitance C1 262, while another replaces all or part of C2 264. In that case, the capacitors C1 262 and C2 264 connect to Vcont2 rather than VSS as shown in FIG. 2A. In a specific embodiment, the circuits of FIGS. 4 and 5 combine to form part of the capacitors C1 262 and C2 264 in FIG. 2.

In a specific embodiment, capacitors C1 510 and C2 520 are reverse-biased diodes or junction varactors. Alternately, they may be MOS capacitors. The capacitors C1 510 and C2 520, and the resistor R1 530 may be constructed similar to capacitors C1 410 or C2 420, and resistor R1 470 in FIG. 4.

Vcont2 may be an analog control voltage from a phase-locked loop, such as the control voltage Vtune on line 125 in FIG. 1, while Vcont1 may be a $K_{vco}$ control signal. Alternately, these functions may be reversed. The $K_{vco}$ control signal may be continuous or digital.

Again, the $K_{vco}$ of an oscillator is the change in a VCO's oscillation frequency per change in control voltage. Thus, the greater the change in capacitance seen by the VCO per change in control voltage, the greater the $K_{vco}$. In a VCO using the circuits of FIGS. 4 and 5, $K_{vco}$ is reduced by the presence of C1 410, C3 430, C5 450 in FIG. 4, and C1 510 in FIG. 5. For example, in a specific VCO incorporating the circuit of FIG. 5, C2 520 varies as a function of Vcont2 at a certain rate. Since the capacitance seen by the VCO is the series combination of C1 510 and C2 520, the capacitance seen by the VCO varies as a function of voltage at a lower rate than does C2 520 alone. Thus, the value of C1 510 may be adjusted by changing Vcont1 such that the resulting $K_{vco}$ is no larger than required to tune the VCO over a desired range. Specifically, a larger value of C1 510 results in more of the capacitance C2 520 being coupled to the tank, leading to a higher $K_{vco}$, while smaller valued C1 510 passes less of the capacitance of C2 520, resulting in a lower $K_{vco}$. Properly adjusting the value of C1 510 allows for maximum immunity to noise on the control line while still allowing the VCO to be tuned properly.

In an embodiment of the present invention, the VCO of FIG. 2A may incorporate the circuit of FIG. 5 as each of the variable capacitors C1 262 and C2 254. Fout line 550 of FIG. 5 connects to nodes 270 and 280 in FIG. 2A, and the capacitors connect to Vcont2 rather than VSS. The voltage Fout on line 550 has an average value of VDD, thus the average voltage across C1 510 is VDD less the control voltage Vcont1 on line 540. Accordingly, the control voltage Vcont1 may be used to adjust the value of C1, and thus the $K_{vco}$. The voltage across C2 520 is the voltage Veont1 less the control voltage Vcont2 on line 560. Thus, the control voltage Vcont2 may be used to adjust the value of C2 520, and thus the frequency of oscillation of the VCO.

Figure 6:
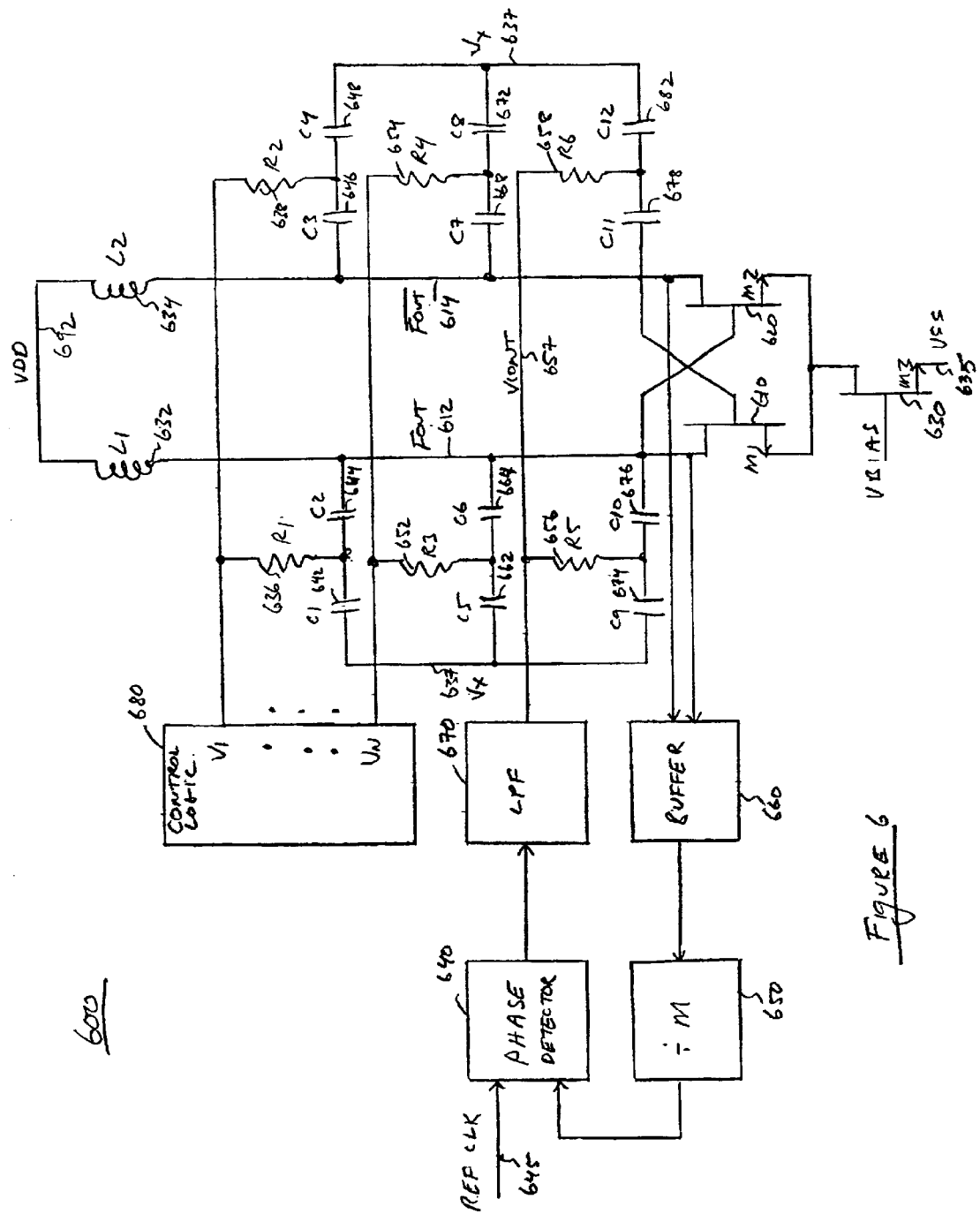
FIG. 6 is a schematic of a phase-locked loop in accordance with an embodiment of the present invention.

FIG. 6 is a schematic of a phase-locked loop 600 consistent with an embodiment of the present invention. Included are VCO pair M1 610 and M2 620 configured as a cross-coupled differential pair, current source M3 630, inductors L1 632 and L2 634, and several tunable capacitance networks. Also included is a phase detector 640, low-pass filter 670, buffer 660, and divider 650. A control logic block 680 is also included, which outputs control logic signals V1 through VN. These control signals are applied to resistors R1 636 and R2 638, N-2 pairs of intervening resistors not shown for simplicity, and R3 652 and R4 654. These control logic signals may be high or low, thus altering the value of effective capacitance contributed by capacitors C1 642, C2 664, C3 646, and C4 648, N-2 pairs of series capacitors not shown for simplicity, and C5 662, C6 664, C7 668, and C8 672. The control logic signals can be used for compensating for process tolerances, for band selection, and frequency hopping.

A reference clock is applied to the phase detector 640 on line 645. The reference clock may be generated by a crystal, or other periodic signal source. The buffer 650 isolates the VCO from the divider 650. The divider 650 divides the output frequency of the VCO, in this example by the value "m". Phase detector 640 compares the reference clock frequency to the frequency of the signal at the divider's output on line 145, and outputs a signal having an amplitude that is proportional to the differences in their frequencies. That signal is filtered by the low-pass filter 670 resulting in Vcont on line 657, which is applied to the isolation resistors R5 656 and R6 658.

The frequency of the VCO output signal varies with changes in the Vcont signal on line 657. If the frequency of the signal at the output of the divider 650 is higher than the reference clock, the signal at the output of phase detector 640, and thus Vcont, changes such that the VCO's frequency decreases. Alternately, if the frequency of the signal at the output of the divider 650 is lower than the reference clock, the signal at the output of phase detector 640, and thus Vcont, changes such that the VCO's frequency increases. In this way, the VCO output maintains a frequency that is a multiple "m" of the frequency of the reference clock applied on line 645. One skilled in the art appreciates that this may be alternately configured. For example, a charge pump may be inserted between the phase detector 640 and low-pass filter 670.

The voltage V1 on line 637 may be VSS, VDD, or other control, bias, or circuit voltage. In a specific embodiment, C1 642, C5 662, C9 674, C4 648, C8 672, and C12 682 are reversed-biased diodes or junction varactors, whose junction capacitances are determined by V1, VN, and Vcont. Again, these may alternately be MOS varactors. These variable capacitances are AC coupled through C2 644, C6 664, C10 676, C3 646, C7 668, and C11 678 to the inductors and nodes 612 and 614. The values of the resulting capacitances, the inductors L1 632 and L2 634, and the stray and parasitic capacitances and inductances determine the frequency of oscillation of the VCO. The capacitors, resistors, and other components may be the same or similar structures as those in FIGS. 4, 5, and the other figures.

Figure 7:
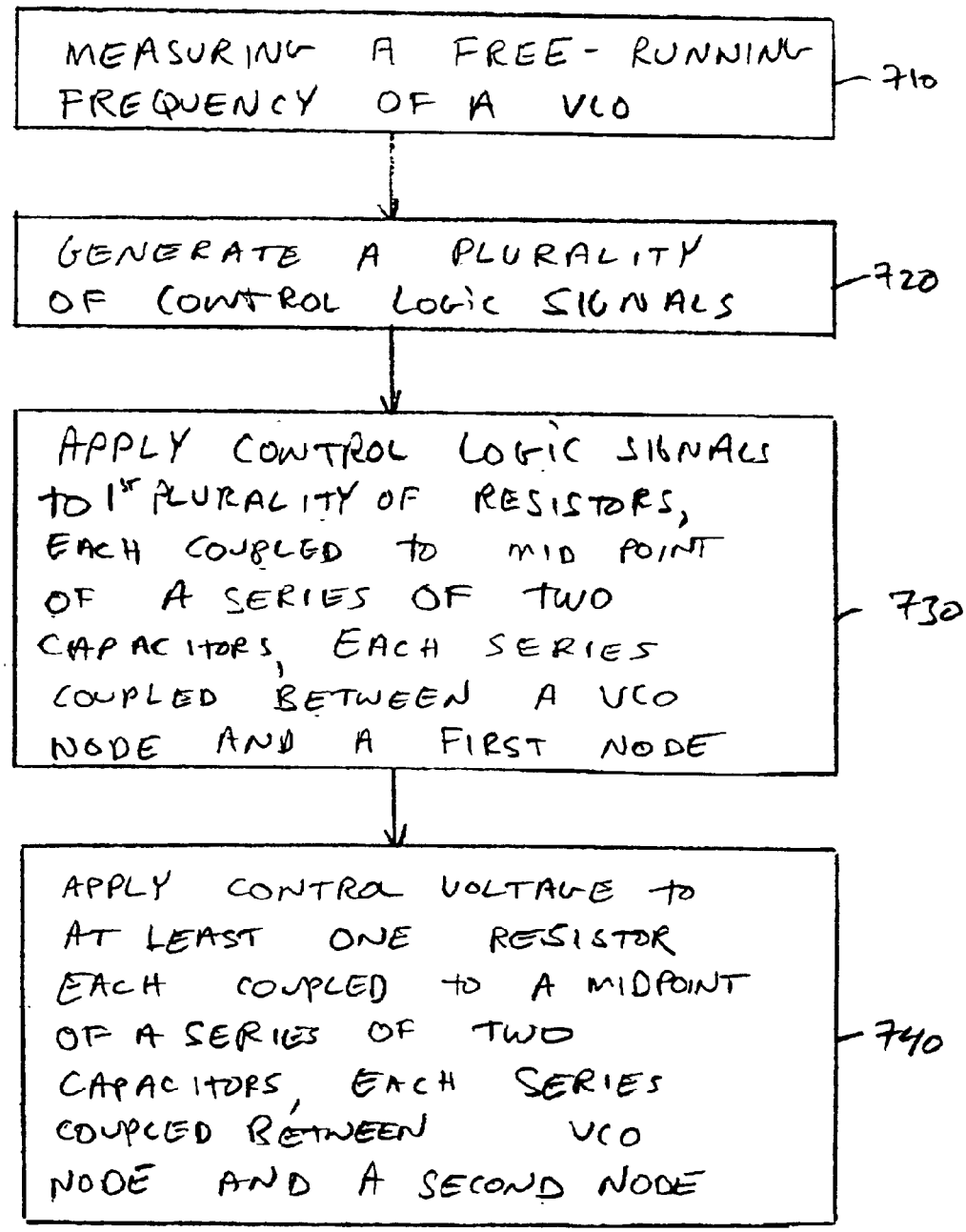
FIG. 7 is a flow chart of a method for tuning a VCO in accordance with an embodiment of the present invention.

FIG. 7 is a flow chart of a method for tuning a VCO consistent with an embodiment of the present invention. In act 710, the frequency of a VCO is measured. In act 720, control logic signals are generated based on a comparison of the measured frequency of the VCO and the desired frequency of the VCO. The control logic signals are applied to a first plurality of resistors, where each resistor is coupled to the midpoint of a series of two capacitors, each of the series being coupled between a VCO node and a first node. This first node may be a control signal line, or any reference signal line such as supply, ground, or other bias point. In act 740, a control voltage is applied to at least one resistor. This resistor is coupled to a midpoint of a series of two capacitors, each series being coupled between the node of the VCO and a second node. The second node may be connected to the first node, and the second node may be a control signal line, or any reference signal line such as supply, ground, or other bias point.

Figure 8:
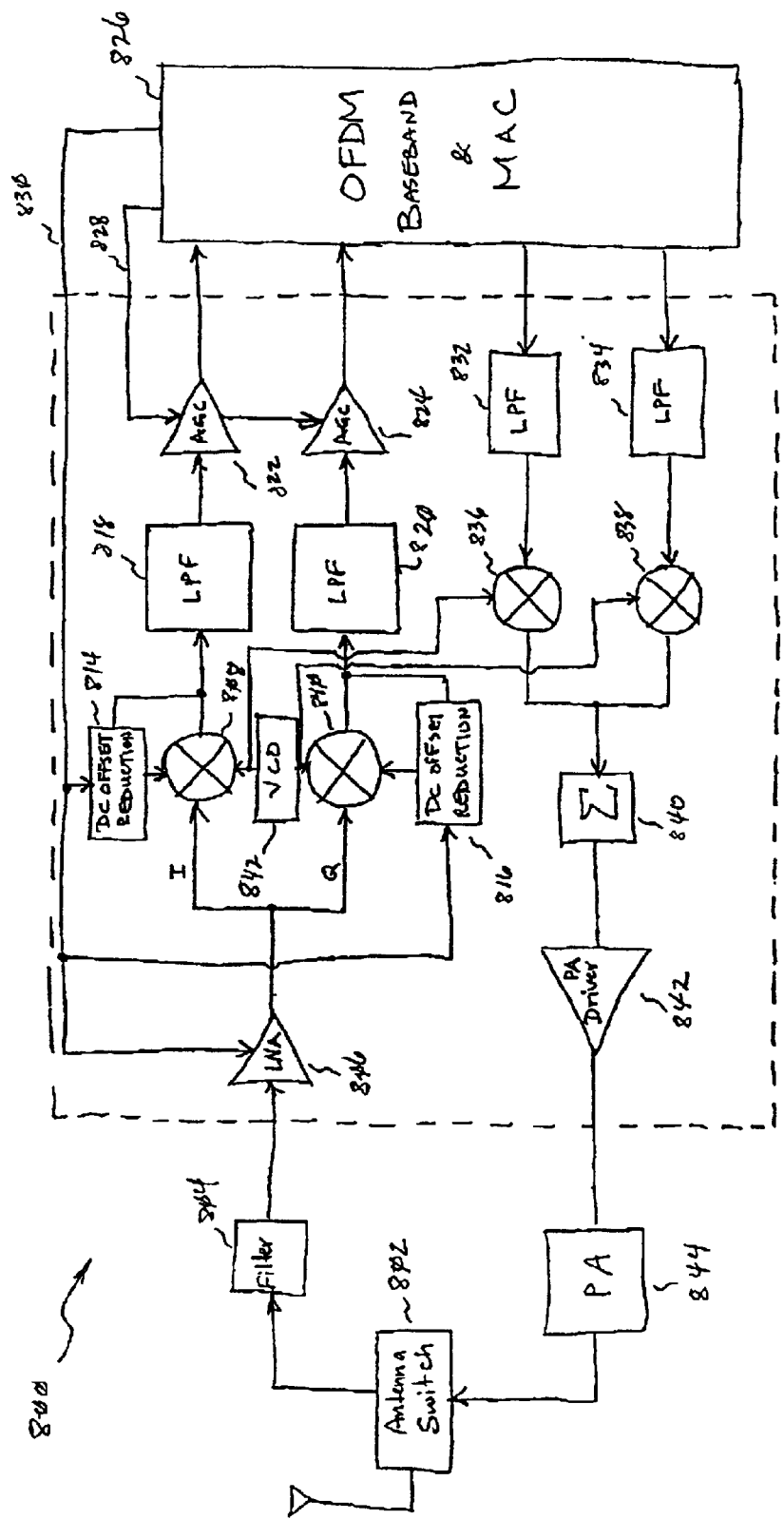
FIG. 8 is a block diagram of an RF transceiver with a VCO in accordance with an embodiment of the present invention.

FIG. 8 is a block diagram of an RF transceiver 800 with a VCO 812 in accordance with an embodiment of the present invention. This block diagram is shown for illustrative purposes only, and does not limit either the possible applications of embodiments of the present invention, or the claims. An antenna switch 802 operates to connect the antenna either to the receiver or the transmitter circuitry of transceiver 800. The receive channel includes a filter 804 that receives the signal from the antenna and operates to reject unwanted signals such as noise from adjacent channels. A low noise amplifier 806 amplifies the signal at the output of filter 804, and supplies it to in-phase (I) and quadrature-phase (Q) down-conversion mixers 808 and 810, respectively. A voltage controlled oscillator 812 generates a pair of local oscillating signals that are 90 degrees out-of-phase with respect to each other. The local oscillating signals are respectively supplied to the I and Q mixers. DC offset reduction circuits 814 and 816 are coupled around mixers 808 and 810. An example of a preferred implementation of such an offset reduction circuit can be found in commonly-assigned patent application Ser. No. 09/768,841, filed Jan. 23, 2001, attorney docket number 20798-001100US, which is incorporated by reference. The I and Q signals are respectively filtered by low-pass filters (LPFs) 818 and 820, and the filtered signals are applied to automatic gain control (AGC) circuits 822 and 824. One example of a preferred implementation for LPFs 818 and 820 is described in greater detail in commonly-assigned patent application Ser. No. 09/612,116, titled "Active Circuit having LC Trap Functionality," which is hereby incorporated by reference. The baseband signal processing is performed by block 826 that receives outputs of AGCs 822 and 824 and converts the analog signals to digital signals before processing them using, for example, orthogonal frequency division multiplexing (OFDM). In this embodiment, block 826 also provides media access control (MAC) functionality. The gain adjustment control signals 828 and 830 are provided by block 826. Control signal 828 adjusts the gain of AGCs 822 and 824. Control signal 830 adjusts the gain of LNA 806, DC offset reduction circuits 814 and 816, and, in some embodiments, mixers 808 and 810.

The transmit channel includes low-pass filters (LPFs) 832 and 834 that receive the I and Q signals and supply them to I and Q up-conversion mixers 836 and 838. In this embodiment, both transmit and receive signals are differential in nature. The up-converter mixers 836 and 838 each receive one of the VCO output signals which are in quadrature. Mixers 836 and 838 combine to form the image reject mixer discussed above with respect to FIG. 1. The outputs of the two up-conversion mixers are combined and applied to a differential to single-ended converter 840. An example of a preferred implementation of such an single-ended converter can be found in commonly-assigned patent application Ser. No. 09/784,735, filed Feb. 14, 2001, attorney docket number 20798-000800US, which is incorporated by reference. The single-ended output of converter 840 is supplied to a power amplifier driver 842 which drives the input of a power amplifier 844 which is connected to switch 802. In a specific embodiment, this block diagram implements a 5 GHz RF transceiver according to the IEEE 802.11a standard.

Figure 9:
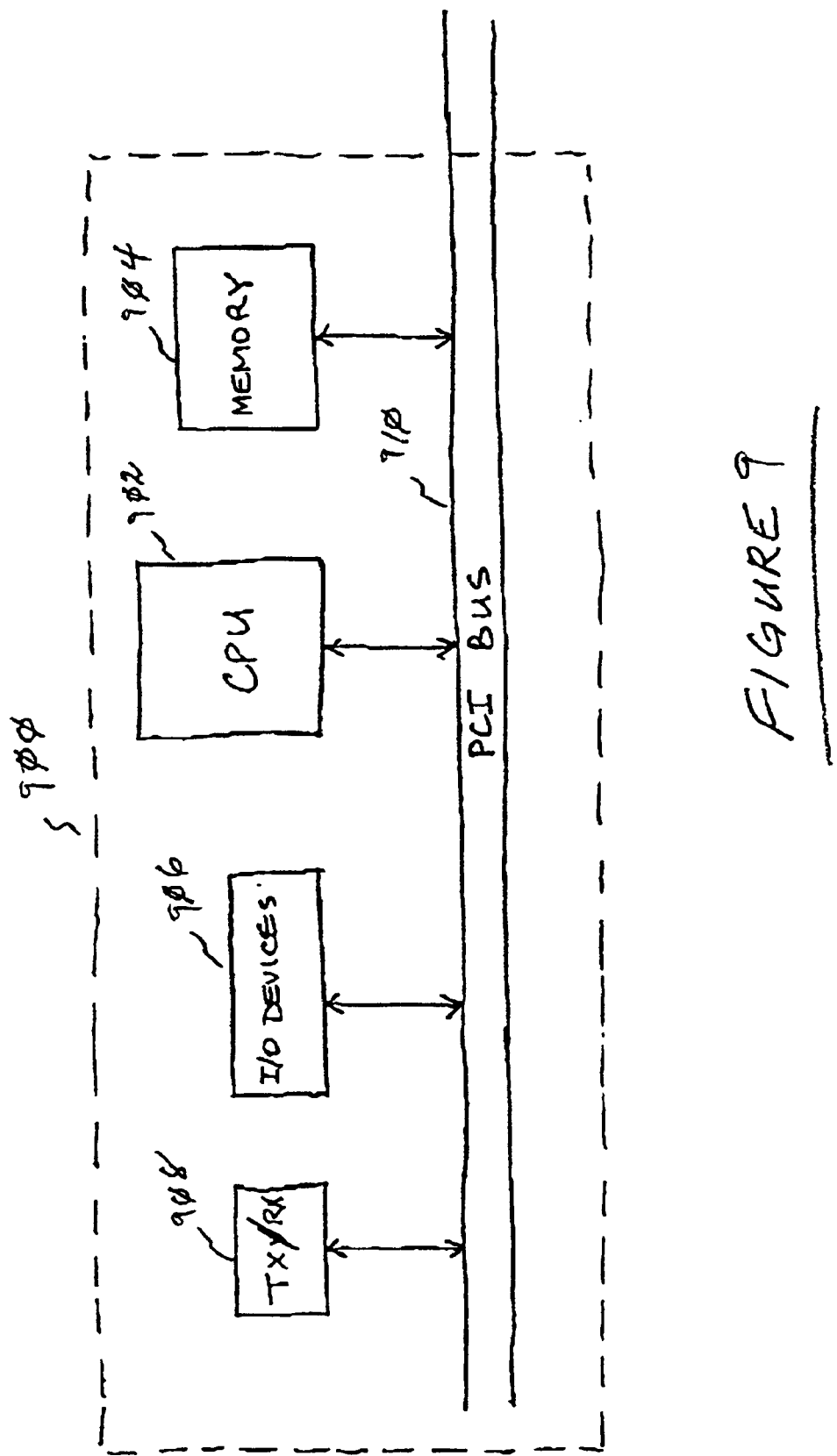
FIG. 9 shows a simplified block diagram for one example of an electronic system having optimized performance according to the present invention.

According to another embodiment of the present invention, the differential to single-ended technique as embodied in the transceiver of FIG. 8 allows for implementation of various electronic systems that are capable of wireless RF communication with optimized performance. Such electronic systems include desktop and laptop personal computers, mobile telephone, television and internet devices, home gateways and media servers, portable digital music devices, data pipes and the like. FIG. 9 shows a simplified block diagram for one example of an electronic system having optimized performance according to the present invention. In this example, a desktop personal computer 900 is used for illustrative purposes. System 900 includes a central processing unit (CPU) 902, memory 904, input/output (I/O) devices 906 and transceiver 908 all coupled to a common personal computer interface (PCI) bus 910. Transceiver 908 may be incorporated into and couple to PCI bus 910 via I/O devices block 906. Transceiver 908 is of the type described above in connection with FIG. 8. Via PCI bus 910, transceiver 908 allows system 900 to wirelessly communicate with other RF wireless devices.

The foregoing description of specific embodiments of the invention has been presented for the purposes of illustration and description. It is not intended to be exhaustive or to limit the invention to the precise form described, and many modifications and variations are possible in light of the teaching above. The embodiments were chosen and described in order to best explain the principles of the invention and its practical applications to thereby enable others skilled in the art to best utilize the invention in various embodiments and with various modifications as are suited to the particular use contemplated. Other embodiments will be apparent to those of ordinary skill in the art. It is intended that the scope of the invention be defined by the following claims.

What is claimed is:

1. A method of tuning a voltage controlled oscillator comprising:
   dividing frequency of oscillation of a voltage controlled oscillator to provide a divided frequency of oscillation;
   comparing the divided frequency of oscillation to the desired frequency;
   providing a tuning voltage based on comparing the divided frequency of oscillation to the desired frequency;

providing a control signal for controlling a change in the frequency of oscillation per change in the tunning voltage; and applying the control signal to a first terminal of a resistor having a second terminal coupled to a node connecting a first terminal of a first variable capacitor and a first terminal of a second variable capacitor, the first variable capacitor having a second terminal coupled to an inductor; and applying the tuning voltage to a second terminal of the second variable capacitor.

2. A method of tuning a voltage controlled oscillator comprising:

dividing a frequency of oscillation of a voltage controlled oscillator to provide a divided frequency of oscillation;

comparing the divided frequency of oscillation to the desired frequency;

providing a tuning voltage based on comparing the divided frequency of oscillation to the desired frequency;

providing control signal for controlling a change in the frequency of oscillation per change in the tuning voltage; and applying the tuning voltage to a first terminal of a resistor having a second terminal coupled to a node connecting a first terminal of a fist variable capacitor and a first terminal of a second variable capacitor, the first variable capacitor having a second terminal couple to an inductor; and applying the control signal to a second terminal of the second variable capacitor.

3. The method of claim 1 wherein each of the first and second variable capacitors is a junction varactor.

4. The method of claim 1 wherein each of the first and second variable capacitors is a MOS varactor.

5. The method of claim 1 wherein each of the first and second variable capacitors is a junction varactor.

6. The method of claim 1 wherein each of the first and second variable capacitors is a MOS varactor.

7. A voltage controlled oscillator comprising:

a first inductor;

a first variable capacitor having a first terminal coupled to a first terminal of the first inductor;

a second variable capacitor having a first terminal coupled to a second terminal of the first variable capacitor; and a first isolation resistor having a first terminal coupled to a node connecting the second terminal of the first variable capacitor and the first terminal of the second variable capacitor and having a second terminal confined to receive a first control voltage, wherein a second terminal of the second variable capacitor is configured to receive a second control voltage.

8. The circuit of claim 7 wherein the first control voltage is a function of a comparison of a divided frequency of oscillation and a desired frequency.

9. The circuit of claim 8 wherein the second control voltage controls a change in an oscillation frequency of the voltage controlled oscillator per change in the first control voltage.

10. The circuit of claim 9 wherein the first control voltage is a logic signal.

11. The circuit of claim 9 wherein the first control voltage is an analog signal.

12. The circuit of claim 7 wherein the second control voltage is a function of a comparison of a divided frequency of oscillation and a desired frequency.

13. The circuit of claim 12 wherein the first control voltage controls a change in the frequency of oscillation per change in the second control voltage.

14. The circuit of claim 13 wherein the first control voltage is a logic signal.

15. The circuit of claim 13 wherein the first control voltage is an analog signal.

16. The integrated circuit of claim 7 further comprising:

a second inductor;

a third variable capacitor having a first terminal coupled to a second terminal of the second inductor;

a fourth variable capacitor having a first terminal coupled to a second terminal of the third variable capacitor and having a second terminal configured to receive the second control voltage;

a second isolation resistor having a first terminal coupled to a second node connecting the second terminal of the third variable capacitor and the first terminal of the fourth variable capacitor and having a second terminal configured to receive the first control voltage;

a first device having a drain coupled to the first terminal of the first inductor and a gate coupled to the first terminal of the second inductor; and a second device having a drain coupled to the first terminal of the second inductor and a gate coupled to first terminal of the first inductor.

17. The circuit of claim 16 further comprising:

a current source coupled to a source of the first device and a source of the second device.

18. The circuit of claim 16 wherein the first device and the second device are n-channel CMOS devices.

19. The circuit of claim 16 wherein the first, second, third, and fourth variable capacitors is a junction varactor.

20. The circuit of claim 16 wherein each of the first, second, third, and fourth variable capacitors is a MOS varactor.

21. A phase-locked loop comprising:

a phase detector configured to receive a reference clock and a divided frequency of oscillation;

a low-pass filter coupled to the phase detector and adapted to produce a first control voltage;

a voltage-controlled oscillator coupled to the low-pass filter and adapted to receive the first control voltage and produce a frequency of oscillation; and a divider adapted to receive the frequency of oscillation and provide the divided frequency of oscillation, wherein the voltage controlled oscillator comprises:

a first inductor;

a second inductor;

a first variable capacitor having a first terminal coupled to a first terminal of the first inductor;

a second variable capacitor having a first terminal coupled to a first terminal of the second inductor, a third variable capacitor having a first terminal coupled to a second terminal of the first variable capacitor and having a second terminal configured to receive a second control voltage;

a fourth variable capacitor having a first terminal coupled to a second terminal of the second variable capacitor and having a second terminal configured to receive the second control voltage;

a first isolation resistor having a first terminal coupled to a fist node connecting the second terminal of the first variable capacitor and the first terminal of the third variable capacitor and having a second terminal configured to receive the first control voltage;

a second isolation resistor having a first terminal coupled to a second node connecting the second terminal of the second variable capacitor and the first terminal of the fourth variable capacitor and having a second terminal configured to receive the first control voltage;

a first device having a drain coupled to the first terminal of the first inductor and a gate coupled to the first terminal of the second inductor; and a second device having a drain coupled to the first terminal of the second inductor and a gate coupled to the first terminal of the first inductor.

22. The phase lock loop of claim 21 wherein the voltage controlled oscillator further comprises one or more capacitive circuits each comprising:

a fifth variable capacitor having a first terminal coupled to the first terminal of the first inductor;

a sixth variable capacitor having a first terminal coupled to the first terminal of the second inductor;

a seventh variable capacitor having a first terminal coupled to a second terminal of the fifth variable capacitor and having a second terminal configured to receive the second control voltage;

an eighth variable capacitor having a first terminal coupled to a second terminal of the sixth variable capacitor and having a second terminal configured to receive the second control voltage;

a third isolation resistor having a first terminal coupled to a third node connecting the second terminal of the fifth variable capacitor and the first terminal of the seventh variable capacitor and having a second terminal configured to receive one of one or more additional control voltages;

a second isolation resistor having a first terminal coupled to a fourth node connecting the second terminal of the sixth variable capacitor and the first terminal of the eighth variable capacitor and having a second terminal configured to receive the one of the one or more additional control voltages.

23. The phase lock loop of claim 22 further comprising control logic adapted to provide the one or more additional control voltages.

24. The phase lock loop of claim 21 wherein the first device and the second device are n-channel CMOS devices.

25. The phase lock loop of claim 21 wherein the first, second, third, and fourth variable capacitors are junction varactors.

26. The integrated circuit of claim 21 wherein the first, second, third, and fourth capacitors are MOS varactors.

* * * * *